(12) United States Patent
Xu et al.

(10) Patent No.: US 9,200,378 B2
(45) Date of Patent: Dec. 1, 2015

(54) METHODS OF MAKING NANOWIRES

(75) Inventors: Jingming Xu, Providence, RI (US);
Chih-Hsun Hsu, Cambell, CA (US);
Sylvain Cloutier, Saint-Bruno, CA (US)

(73) Assignee: Brown University, Providence, RI (US)

( * ) Notice: Subject to any disclaimer, the term of this patent is extended or adjusted under 35 U.S.C. 154(b) by 62 days.

(21) Appl. No.: 13/814,249

(22) PCT Filed: Jul. 29, 2011

(86) PCT No.: PCT/US2011/045820
§ 371 (c)(1),
(2), (4) Date: Apr. 23, 2013

(87) PCT Pub. No.: WO2012/018678
PCT Pub. Date: Feb. 9, 2012

(65) Prior Publication Data
US 2013/0209683 A1 Aug. 15, 2013

Related U.S. Application Data

(60) Provisional application No. 61/371,239, filed on Aug. 6, 2010.

(51) Int. Cl.
| | |
|---|---|
| C23C 16/00 | (2006.01) |
| C30B 25/00 | (2006.01) |
| C30B 29/04 | (2006.01) |
| C30B 29/60 | (2006.01) |
| B82Y 40/00 | (2011.01) |

(52) U.S. Cl.
CPC ............... *C30B 25/005* (2013.01); *C30B 25/00* (2013.01); *C30B 29/04* (2013.01); *C30B 29/60* (2013.01); *B82Y 40/00* (2013.01)

(58) Field of Classification Search
CPC ...... C30B 25/00; C30B 25/005; C30B 29/04; C30B 29/60; C30B 29/62; C30B 29/66; B82Y 40/00; C23C 16/26
USPC .......................................... 427/249.1, 248.1
See application file for complete search history.

(56) References Cited

U.S. PATENT DOCUMENTS

2007/0021538 A1 1/2007 Bae et al.
2007/0212538 A1* 9/2007 Niu ............................... 428/367

OTHER PUBLICATIONS

Hsu et al. Synthesis of Diamond Nanowires Using Atmospheric Pressure Chemical Vapor Deposition, Nanoletters, Aug. 2, 2010, 10, pp. 3272-3276.*
Sun et al. Diamond Nanorods from Carbon Nanotubes, Advanced Materials, Oct. 2004, 16. No. 20, p. 1849-1853.*
International Search Report issued from corresponding PCT/US2011/045820, dated Nov. 30, 2011.
Cloutier, Sylvain G., "Unique Properties of Nano-Engineered Optical Materials," May 2006, Division of Engineering at Brown University.
Hsu et al. Synthesis of Diamond Nanowires Using Atmospheric-Pressure Chemical Vapor Deposition. Nano Letters, Aug. 2, 2010, pp. 3272-3276.

* cited by examiner

*Primary Examiner* — Kelly M Gambetta
(74) *Attorney, Agent, or Firm* — Banner & Witcoff, Ltd.

(57) ABSTRACT

The present invention is directed towards methods for growing diamond nanowires via chemical vapor deposition and apparatuses that incorporate these diamond nanowires.

12 Claims, 4 Drawing Sheets

METHODS OF MAKING NANOWIRES

RELATED APPLICATION DATA

This application is a National Stage Application under 35 U.S.C. 371 of PCT application PCT/US2011/045820 designating the United States and filed Jul. 29, 2011; which claims the benefit of U.S. patent application No. 61/371,239 and filed Aug. 6, 2010 each of which are hereby incorporated by reference in their entireties.

FIELD

The present invention relates to the field nanotechnology and, in particular, to the fields of nanowire growth using chemical vapor deposition.

BACKGROUND

Among the discovered carbon allotropes, diamond has long been a material of interest for research due to its unique properties. Of all known materials, it is the hardest and has the highest thermal conductivity (Spear, K. E., *J. Am Ceram. Soc.* 1989, 72, 171-191). Its wide band gap, high electron and hole mobility, and negative electron affinity (NEA) make it an attractive candidate for use in ultraviolet (UV) light detectors and emitters (Koizumi, S, et al., *Science* 2001, 292, 1899-1901), radiation particle detectors (Monroy, E. et al., *Semicond. Sci. Technol,* 2003, 18, R33-R51), field effect transistors (Isberg, J. et al., *Science* 2002, 297, 1670-1672), electron field emission sources (Okano, K., et al. *J. Nature* 1996, 381, 140-141), position-sensitive biochemical substrates (Yang, W. et al., *Nat. Mater.* 2002, 1, 253-257), and many other possible applications, including those subjected to harsh environments such as high temperatures or high-power devices for space applications.

Techniques for growing crystalline diamond have evolved from the high-temperature high-pressure (HTHP) method (Bundy, F. P. et al., *Nature* 1955, 176, 51-55) to plasma enhanced chemical vapor deposition (PECVD) techniques that typically operate at 120-220-Torr and 900-1500° C. followed by microwave annealing at high temperature (Meng, H. K. et al., *J. Proc. Natl. Acad. Sci.* U.S.A. 2008, 105, 17620-17625). Diamond microwires with 25 μm diameter and 400 μm length were synthesized in 1968 using a radiation heating unit developed from a super-high pressure xenon tube (Derjaguin, B. V. et al., *J. Cryst. Growth* 1968, 2, 380-384). Some top-down approaches employed include reactive ion etching to fabricate diamond nanowires 3-10 nm in length (Yang, N. J. et al., *Nano Lett,* 2008, 8, 3572-3576), and using porous anodic aluminum oxide as a template to form a diamond cylinder array (Masuda, H. et al., *Adv. Mater* 2001, 13, 247-249). Post-treatment of carbon species and PECVD techniques have been used to make diamond nanorods of low crystallinity of up to 200 nm in length (Sun, L. T. et al., *Adv. Mater.* 2004, 16, 1849-1853; Vlasov, I. L. et al., *Adv. Mater* 2007, 19, 4058-4062; Shang, N. et al., *ACS Nano* 2009, 3, 1032-1038). Diamond nanowires have also been the subject of various theoretical studies and structural simulations. (Barnard, A. S. et al., *Nano Lett.* 2003, 3, 1323-1328; Barnard, A. S. et al., *Chem Phys.* 2004 120, 3817-3821; Wang, C. X. et al., *Mater. Sci. Eng., R* 2005, 49, 157-202). Synthesis of crystalline diamond nanowires is of major interest since they offer the potential for enabling applications across many disciplines, for advancing the science of material synthesis at the nanoscale and atomic scale, and for validating the search for new forms of carbon. However, the fabrication of long, single crystalline diamond nanowires using conventional thermal CVD methods has so far proven elusive despite the potential benefits.

SUMMARY

Embodiments of the present invention are directed to methods of making nanowires, including nanowires formed from carbon including the diamond form of carbon, using a chemical vapor deposition (CVD) process. In one aspect, a standard carbon nanotube (CNT) growth process is modified with the introduction of sample cooling under a gas flow.

In some aspects, suitable substrates for CVD include diamond crystals, carbide forming materials and their carbides, including silicon, molybdenum, tungsten, silicon carbide and tungsten carbide and the like or other materials, such as copper and gold and the like. In other aspects, chemical vapor deposition occurs near 900° C. and atmospheric pressure.

In one embodiment, diamond nanowires are formed or grown by chemical vapor deposition including the flow of precursor gases over a catalyst solution. In some embodiments, these gases include argon, nitrogen and/or other inert gases, reducing gases such as hydrogen and/or reactive gases such as methane and/or carbon dioxide. Other precursor gases may be suitable. In some embodiments, the precursor gases flow over a catalyst such as iron, nickel, cobalt, manganese, chromium, tantalum or other transition metal catalyst solutions.

According to certain aspects of the present invention, samples are cooled under a gas flow. In some embodiments, pure hydrogen is flowed through the chamber while the temperature is lowered to ambient.

According to certain aspects of the present invention, the diamond nanowires are straight, thin and long, and substantially longitudinally uniform in exterior diameter along a substantial length of the wires. In certain embodiments, the nanowires are 60-90 nm in diameter. In other embodiments, the nanowires are tens of micrometers long. In further embodiments, the wires are highly crystalline, for example containing crystal domains of at least 30×30 nm or single crystals along the entire length of the nanowire. In other embodiments, the wires are encased in a graphite shell and/or within amorphous carbon layers.

A further embodiment of the present invention provides a method of growing diamond nanowires for use in various applications. These applications include, among others, field-effect transistors in which the diamond nanowires are advantageous for high power, high temperature, and/or speeds (Barnard, A. S.; Russo, S. P.; Snook, I. K. *Phys. Rev. B.* 2003, 68, No. 073406-1-4) due to their one-dimensional structure, high mobility, large band gap and breakdown field, and/or high thermal conductivity (Padgett, C. W. et al., *Nano Lett.* 2006, 6, 1827-1831). The applications also include solar-blind, radiation-hard diamond nanowire UV detectors (Monroy, E. et al, *Semicond. Sci. Technol,* 2003, 18, R33-R51) and emitters, DNA sensors, radiation particle detectors, electron field emission sources, position-sensitive biochemical substrates and many other possible applications.

A still further embodiment of the present invention provides an apparatus, such as a field-effect transistor, UV detector, radiation particle detector, electron field emission source, position-sensitive biochemical substrate or DNA sensor comprised of diamond nanowires grown via chemical vapor deposition techniques disclosed herein.

According to one aspect of the present invention, diamond nanowires are formed having certain diameters, lengths, morphologies and crystallinities using moderate growth conditions (e.g., low temperature, low pressure, thermal CVD) to produce stable diamond nanowires such as those discussed in Barnard, A. S, et al. *Nano Lett.* 2003, 3, 1323-1328; Barnard, A. S. et al., *J. Chem Phys.* 2004 120, 3817-3821) or resulting from reduced-pressure transformations (see, Wang, C. X. et al., *Angew. Chem., Int. Ed.* 2005, 44, 7414-7418; Banhart, F. et al., *Nature* 1996, 382, 433-435). Embodiments of the present invention provide methods of making nanoenclosures using certain growth conditions.

DETAILED DESCRIPTION OF CERTAIN EXEMPLARY EMBODIMENTS

Figure 1A:
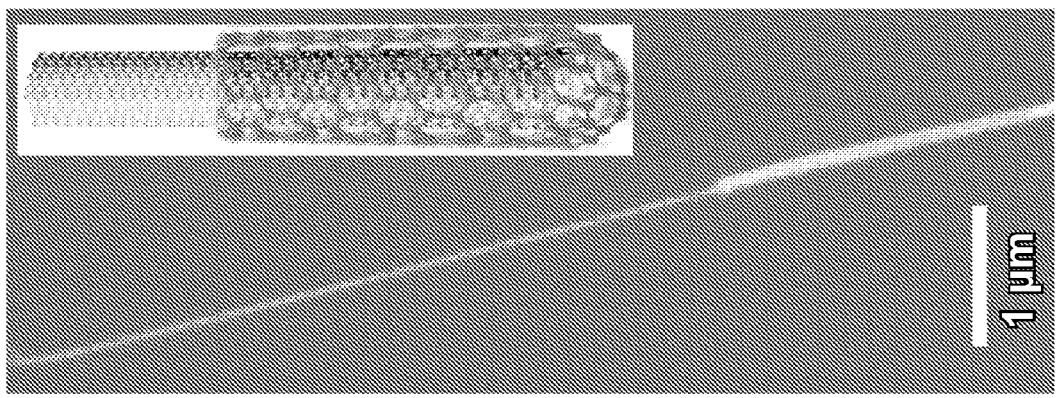
FIG. 1 depicts electron microscope images of diamond nanowires encased within a carbon nanotube shell. (A) Scanning electron microscope (SEM) image of diamond core enclosed in a CNT sheath, typically tens of micrometers in length and 60-90 nm in exterior diameter. A magnified SEM image of the nanowire tip in the upper inset shows a catalyst embedded inside the tip of the nanowire. The SEM image in the lower insert shows the straight and uniform nanowires with flat terminations. (B) SEM image of core-shell diamond nanowire with a portion of the CNT shell stripped away selectively by laser burning. The blurring of the diamond nanowire tip is due to oscillations caused by charge accumulation from the impinging electron beam. (C) Transmission electron microscopy (TEM) image showing the diamond core and CNT walls of the nanowire. The diamond (111) lattice (0.21 nm) is enclosed by the outer CNT shell with a graphite (002) surface (0.34 nm) whose surface stress provides a very high effective pressure (on the order of gigapascals) in which the diamond phase is stable. The low magnification TEM image in the inset shows the core-in-shell wire structure more clearly. The scale bar in the inset is 5 nm.

Embodiments of the present invention are based on the discovery that diamond nanowires can be grown using a chemical vapor deposition (CVD) process. The scope of this invention includes a wide range of chemical vapor deposition processes that can be used to grow diamond nanowires given the benefit of the present disclosure, including, among others, aerosol assisted CVD, direct liquid injection CVD, plasma methods (e.g., microwave plasma-assisted CVD, plasma-enhanced CVD, remote plasma-enhanced CVD), atomic layer CVD, hot wire CVD, combustion CVD, rapid thermal CVD and vapor phase CVD.

In some aspects, suitable substrates for CVD include diamond crystals, carbide forming materials and their carbides, including silicon, molybdenum, tungsten, silicon carbide and tungsten carbide or other materials, such as copper and gold.

In some aspects, chemical vapor deposition occurs over a range of temperatures, including 100° C., 200° C., 500° C., 900° C., 1300° C., etc., and a range of pressures, including atmospheric pressures and low pressures (e.g., as low as $10^{-7}$ Pa). The temperature and/or pressure can be fixed or varied during deposition and/or nanowire growth.

Growth of diamond nanowires via chemical vapor deposition can include the flow of precursor gases over a catalyst solution. In some embodiments, these gases include argon, nitrogen and/or other inert gases, reducing gases such as hydrogen and/or reactive gases such as methane and/or carbon dioxide. Other precursor gases may be suitable. The individual gases can flow over the catalyst at the same rate or different rates. For example, the flow rate ratio of one gas to another can be 100:100 standard cubic centimeters per minute (sccm), 100:200 sccm, 100:300 sccm, 100:400 sccm, 500:100 sccm, 600:100 sccm, 700:100 sccm, 1,000:100 sccm, 10,000:100 sccm, etc. The flow rate and/or the ratios of the flow rates can be held constant or can be varied over time. The gases can be flowed simultaneously or in succession.

In some embodiments, the precursor gases flow over a catalyst solution comprised of, for example, iron, nickel, cobalt, manganese, chromium, alumina, tantalum and/or other transition metals. The catalyst can be formed by many processes, including, for example, sputtering or a sol-gel process followed by spin-coating or dipping. Without wanting to be bound by theory, it is believed that the transition metals facilitate the dissociation of hydrogen at significant low hydrogen dissociation barrier (Gross, A. *Appl. Phys. A.; Mater Sci. Process.* 1998, 67, 627-635; Berger, H. F. et al., *Surf. Sci.* 1992, 261, 313-320).

According to certain aspects of the present invention, samples are cooled under a gas flow. In some embodiments, pure hydrogen or a hydrogen mixture is flowed through the chamber while the temperature is lowered. The gas flow rates over the sample include, for example, 10 sccm, 20 sccm, 50 sccm, 100 sccm, 200 sccm, 300 sccm, 500 sccm, 1000 sccm, etc. The rate of temperature change includes, for example, 0.01° C./min, 0.02° C./min, 0.05° C./min, 1° C./min, 1.1° C./min, 1.2° C./min, 1.5° C./min, 2° C./min, 3° C./min, 5° C./min, 10° C./min, 20° C./min, etc. The rate of the gas flow and/or temperature change can be held constant or varied over time. The temperature can be lowered to ambient temperature or below ambient temperature.

In some embodiments, the resultant diamond nanowires are between 10 nm and 150 nm in diameter. The nanowires are up to tens of microns in length, including 1 micron, 2 microns, 3 microns, 4 microns, 5 microns, 10 microns, 15 microns, 20 microns, 30 microns, 40 microns, 50 microns, 100 microns, 150 microns, 200 microns, etc. In some embodiments, growth conditions or materials can be tailored to control diamond nanowire diameter and/or length. In some embodiments, the nanowires are encased in either a graphite shell or layers of amorphous carbon.

In other embodiments, the diamond nanowires have high crystallinity, including crystal domains that are approximately 10×10 nm, 10×20 nm, 10×30 nm, 20×20 nm, 30×30 nm and larger. In some embodiments, the entire nanowire is comprised of a single crystal with low defect levels. In still other embodiments, the diamond nanowire has a cubic diamond structure. In other embodiments, the diamond nanowires have cylindrical or dodecahedral crystalline structures.

In still other embodiments, the diamond nanowire yield from the CVD process is 1%, 2%, 5%, 10%, 20%, 30%, 40%, 50%, 60%, 70%, etc.

The diamond nanotubes and/or nanowires fabricated using the methods of the present invention confirm theoretical frameworks where stable diamond nanowires have been shown to be possible in computational models and simulations under idealized theoretical settings and without considering the actual growth conditions and environmental limitations. For example, density functional models have shown that diamond nanowires might exist in cubic, cylindrical, or dodecahedral crystalline forms (Barnard, A. S. et al., *Nano Lett.* 2003, 3, 1323-1328). Further, an empirical thermodynamic model suggested that it is possible for a diamond nanowire to grow inside a tubular graphitic enclosure (or carbon nanotube) (Wang, C. X. et al., *Mater. Sci. Eng.*, R 2005, 49, 157-202). For a small-diameter wire, a capillary pressure (or so-called Young-Laplace pressure) $\Delta P \approx 2\gamma/r$ (where r is the radius and $\gamma$ is the surface energy of diamond) can be sufficiently high to allow the diamond phase to exist in the inner core while the outer shell with less equivalent pressure takes on the graphitic phase. Depending on the specific surface and interface energy parameter, within a thick nanotube-like shell of an interior radius around 10-25 nm, or for even smaller dimensions occurring at a defective spot of the nanotube wall, the equivalent pressure could reach the order of 1-5 GPa (Wang, C. X. et al., *Angew. Chem., Int.* Ed. 2005, 44, 7414-7418). Similar phenomena were observed experimentally in diamond nucleation inside carbon onion high curvature enclosures (Banhart, F. et al., *Nature* 1996, 382, 433-435). Molecular dynamic (MD) simulations (Barnard, A. S. et al., *Nano Lett.* 2003, 3, 1323-1328; Barnard, A. S et al., *J. Chem Phys.* 2004 120, 3817-3821) estimate that a stable diamond nanowire could have a diameter on the order of ~10 nm. Though they indicate that growth along the [110] principal axis (the growth direction of our diamond nanowire) may not be stable, these simulations were carried out under boundary conditions that differ from those disclosed herein, and so the diamond nanowire of the present disclosure may be in a different regime. However, the order of magnitude estimate corresponds well to the experimental findings of the wire diameter and the crystal domain size.

Without wishing to be bound by theory, hydrogen has been known to produce a dilution effect that facilitates the transformation of sp and $sp^2$ bonds into $sp^3$ bonds (Lambrecht, W. R. et al., *Nature* 1993, 364, 607-610). It has also been shown that hydrogen locally decomposes amorphous and graphitic deposits quickly (Spear, K. E. *J. Am Ceram.* Soc. 1989, 72, 171-191; Angus, J. C. et al., *J. Appl. Phys.* 1968 39, 2915-2922) allowing methane or other gaseous feedstock to grow diamond preferentially (Chauhan, S. P et al., *J. Appl. Phys.* 1976, 47, 4746-4754). Meanwhile, transition metals are known to facilitate the dissociation of hydrogen molecules into atomic hydrogen at significant low hydrogen dissociation barrier (Gross, A. *Appl. Phys. A.; Mater Sci. Process.* 1998, 67, 627-635; Berger, H. F. et al., *Surf. Sci.* 1992, 261, 313-320). Such atomic hydrogen was demonstrated to enhance diamond nucleation as well as graphite etching and thus has been widely applied in the synthetic diamond growth process.

EXAMPLE

The growth process began with methane and hydrogen flow over an Fe catalyst solution dispersed on a silicon substrate (Li, Y. M. et al., *J. Phys. Chem. B* 2001, 105, 11424-11431) under conventional chemical vapor deposition (CVD) conditions at 900° C. The catalyst for the nanowire synthesis consisted of iron cations dispersed in a sol-gel, made of 11.7 g of tetraethoxysilane (TEOS, 98% purity), 25.9 g of ethanol, 25.3 of deionized water, and 110 mL of hydrochloric acid (HCl). The sol-gel mixture was stirred for 3 h at room temperature and adjusted to pH 5.8 using 0.05 M of sodium hydroxide (NaOH). A 0.1 M iron nitrate-9 hydrate ($Fe(NO_3)_3 \cdot 9H_2O$) 1-propanol solution was then mixed with the as-prepared sol-gel system (volume-ratio 1:1). After 30 min of gelation, the sol-gel based catalyst was spin-coated onto a p-type silicon substrate followed by baking at 70° C. for 30 mins. The resultant distribution of catalyst particle sizes was in the range of 10-30 nm after 700° C. high temperature annealing, as observed by SEM. Diamond nanowire growth was done in an atmospheric pressure chemical vapor deposition (CVD) chamber under isothermal conditions (900° C.). The ratio of methane to hydrogen flow was set at 500:100 standard cubic centimeters per minute (sccm) for 5 min and was then switched to 100:200 sccm for 25 min. After the standard nanotube process was completed, pure hydrogen was flowed through the quartz tube (2.5 cm wide and 1.4 m long) at 200 sccm without having pumped the methane from the chamber. The chamber was then slowly cooled to ambient at the rate of ~1.2° C./min over a period of 12 h. No plasma or energy radiation is used during the CVD growth. When the final step of cooling under hydrogen flow was omitted, carbon nanotubes and amorphous carbon were synthesized but no diamond.

Scanning electron microscope (SEM) imaging (FIG. 1A) showed sparsely distributed straight nanowires that look qualitatively different from the curly carbon nanotubes normally grown in CVD and seen aggregated in a crowded matrix elsewhere in the sample, and from dense agglomerations of mixed diamond and graphite seen in previous studies (Sun, L. T. et al., *Adv. Mater.* 2004, 16, 1849-1853; Vlasov, I. L. et al, *Adv. Mater* 2007, 19, 4058-4062; Shang, N. et al., *ACS Nano* 2009, 3, 1032-1038). The nanowires measured tens of micrometers in length and 60-90 nm in outer diameter.

Figure 1B:
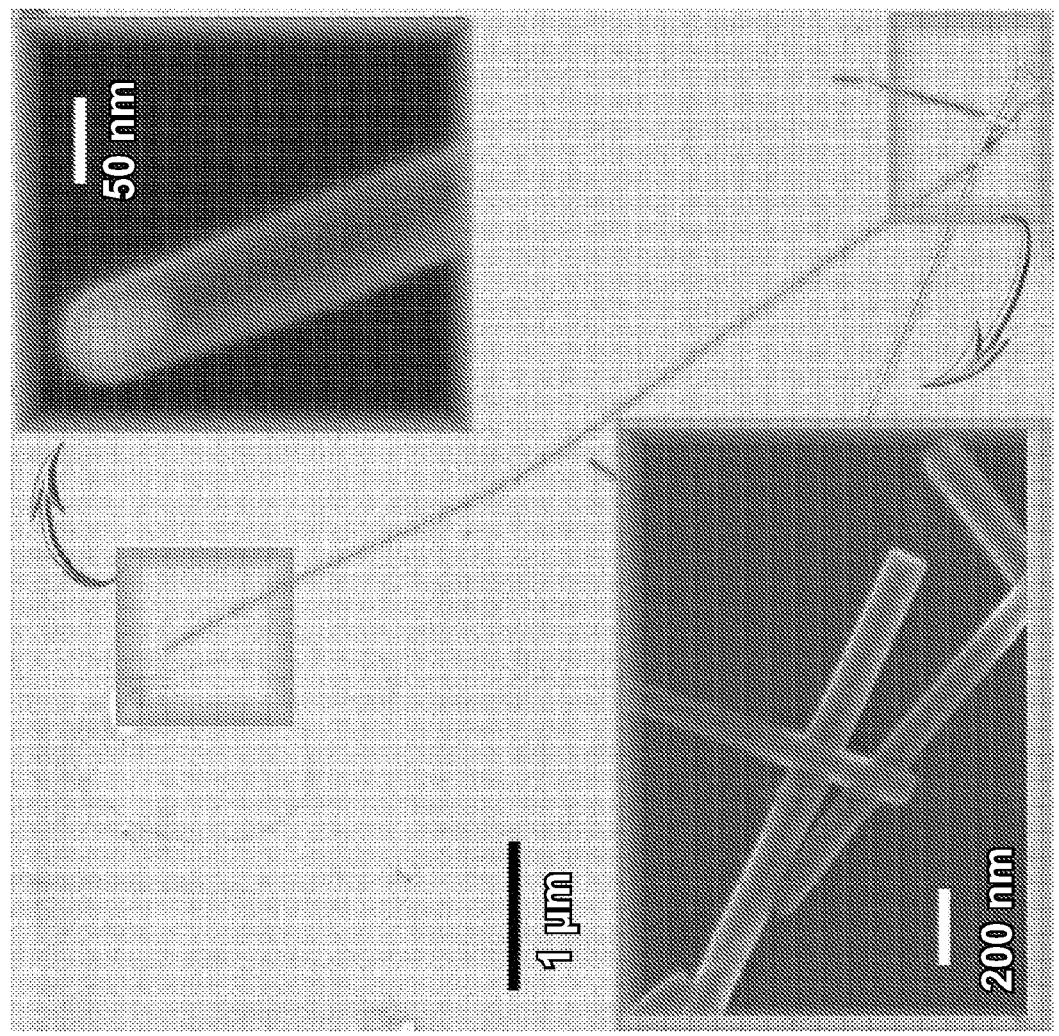

The core-shell structure of a diamond nanowire encased in a graphic shell was also shown in an SEM image where a portion of the nanotube shell was stripped away by a focused 532 nm laser beam in the micro-Raman spectrometer (see FIG. 1B). Note that the diamond nanowire remained intact even after being subjected to prolonged laser exposure, indicative of the difference in light absorption between the transparent wide band gap diamond and the narrow band gap graphitic shell. This also suggested that the diamond nanowire had good crystallinity.

Figure 1C:
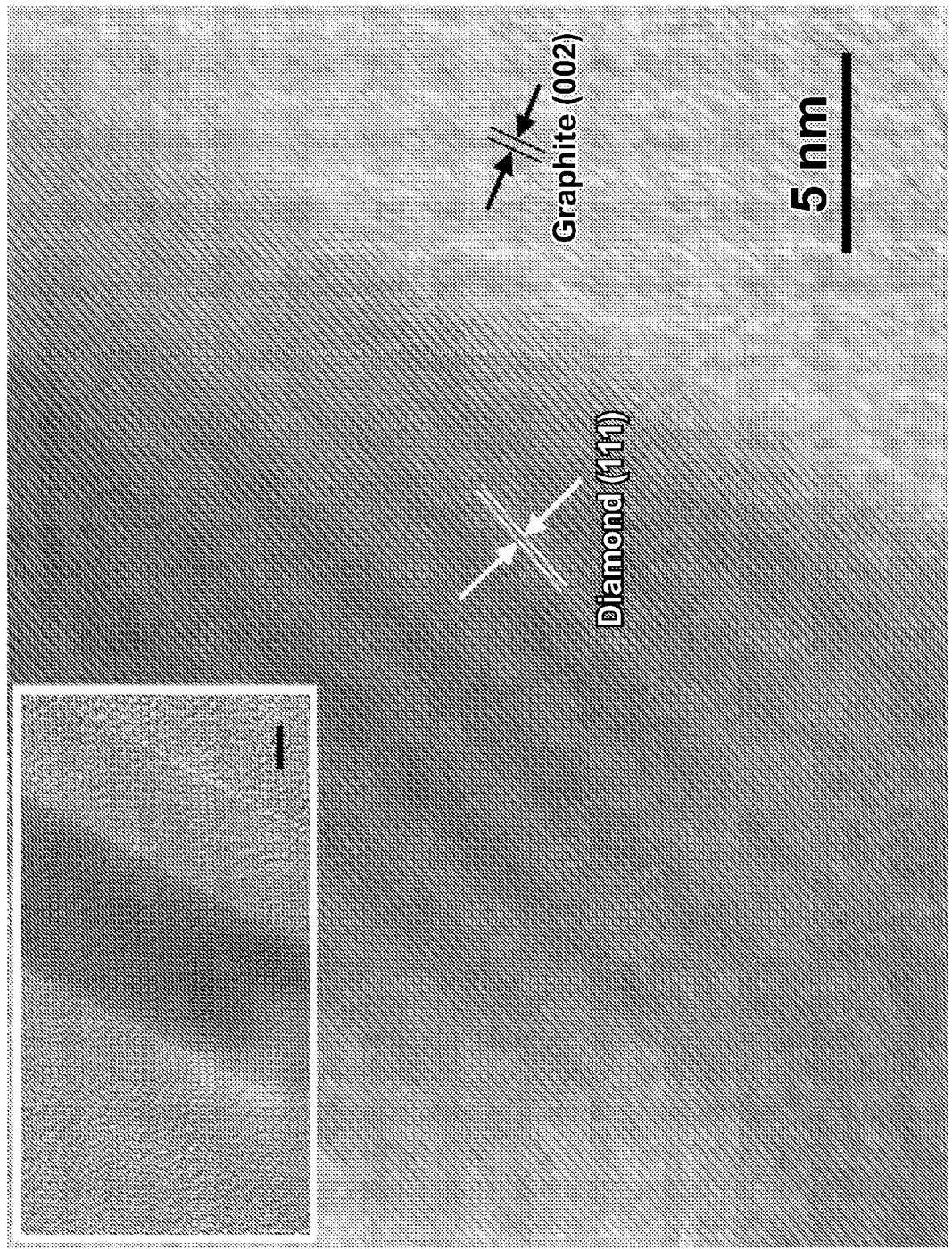

High-resolution transmission electron microscopy (HR-TEM) imaging of the nanowire was performed, as shown in FIG. 1C. HRTEM confirmed that the structure of the nanowire indeed consisted of a diamond core encased within a graphitic shell. In some cases, amorphous carbon layers were observed instead of graphitic shells; however, the diamond nanowires contained within were of the same high-crystalline quality.

Figure 2A:
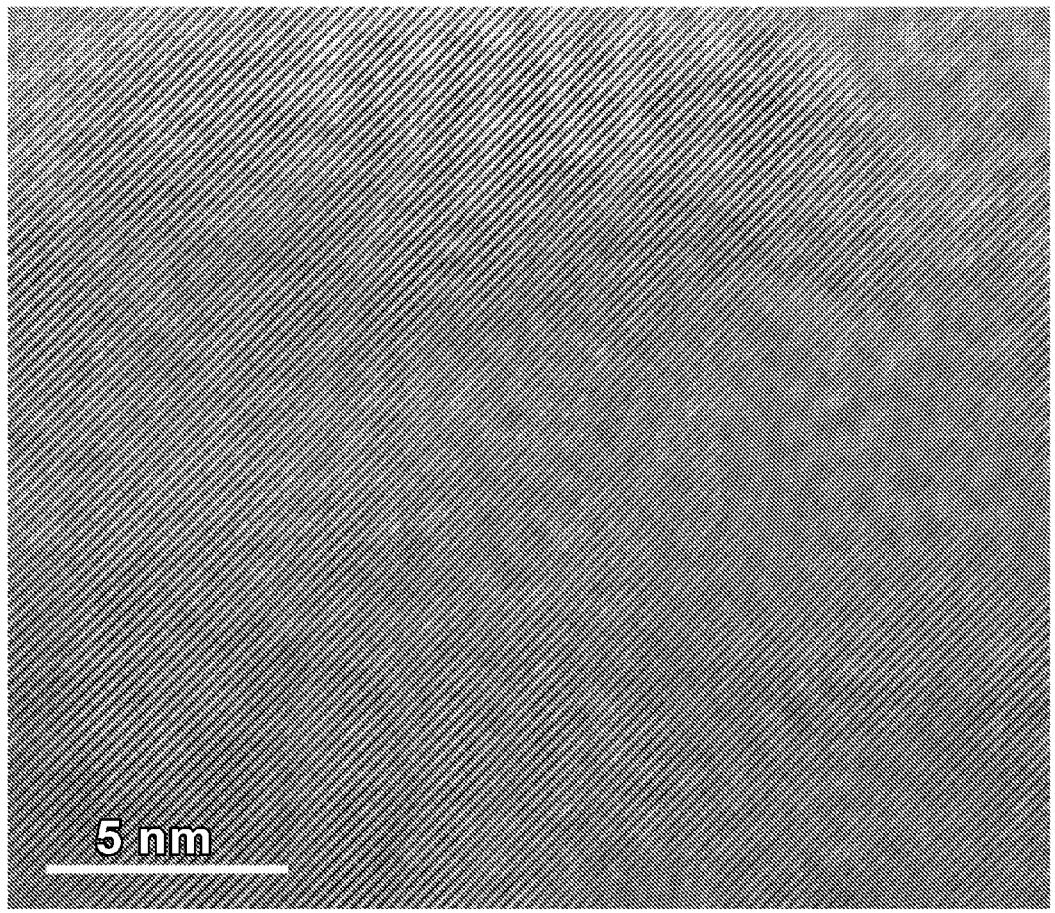
FIG. 2 depicts high-resolution transmission electron microscopy (HRTEM) images of a single diamond nanowire. (A) HRTEM image showing the single-crystallinity of a diamond nanowire with domain size of at least 30 nm×30 nm. (B) The selective area electron diffraction (SAED) pattern taken from the same diamond nanowire also shows a crystalline cubic diamond (c-diamond) structure. (C) A zoomed-in view of the crystalline structure displaying clear lattice planes of cubic diamond (111) surfaces with a lattice constant of 0.21 nm.

Information about the diamond structure of the nanowires was extracted from transmission electron microscopy. FIG. 2A shows a HRTEM image of one of these nanowires, which reveals a crystalline diamond wire structure with a lattice constant of 0.21 nm, corresponding to the (111) orientation of diamond (see also FIG. 2C). This image indicates that the size of the crystal domain is at least 30×30 nm. In fact, in some cases, single crystals with low defects were seen along the length of the entire nanowire.

Figure 2B:
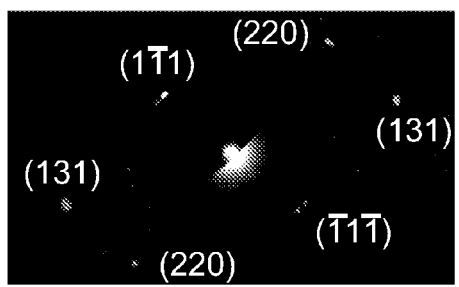
Figure 2C:
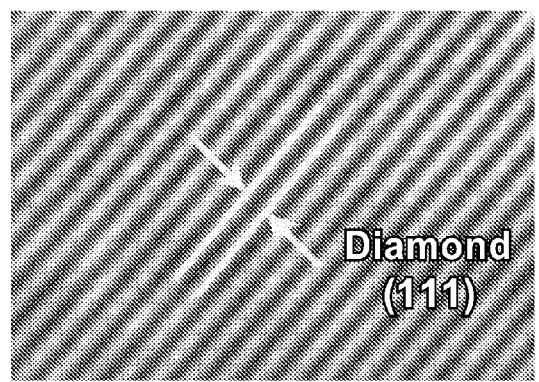

FIG. 2B presents a selective area electron diffraction pattern (SAED) taken from the diamond nanowire along the [−1, 1, 2] zone axis, showing that the nanowire has a crystal-line cubic diamond structure. Electron diffraction patterns taken along multiple zone axes were further examined from the same sample, and again the cubic diamond structure was observed. The SAED experiment also indicated that diamond nanowire has the same lattice parameter as bulk cubic crystalline diamond. The diffraction pattern suggests that the growth directions of this nanowire are along the [2, 2, 0] principal axis.

Figure 3:
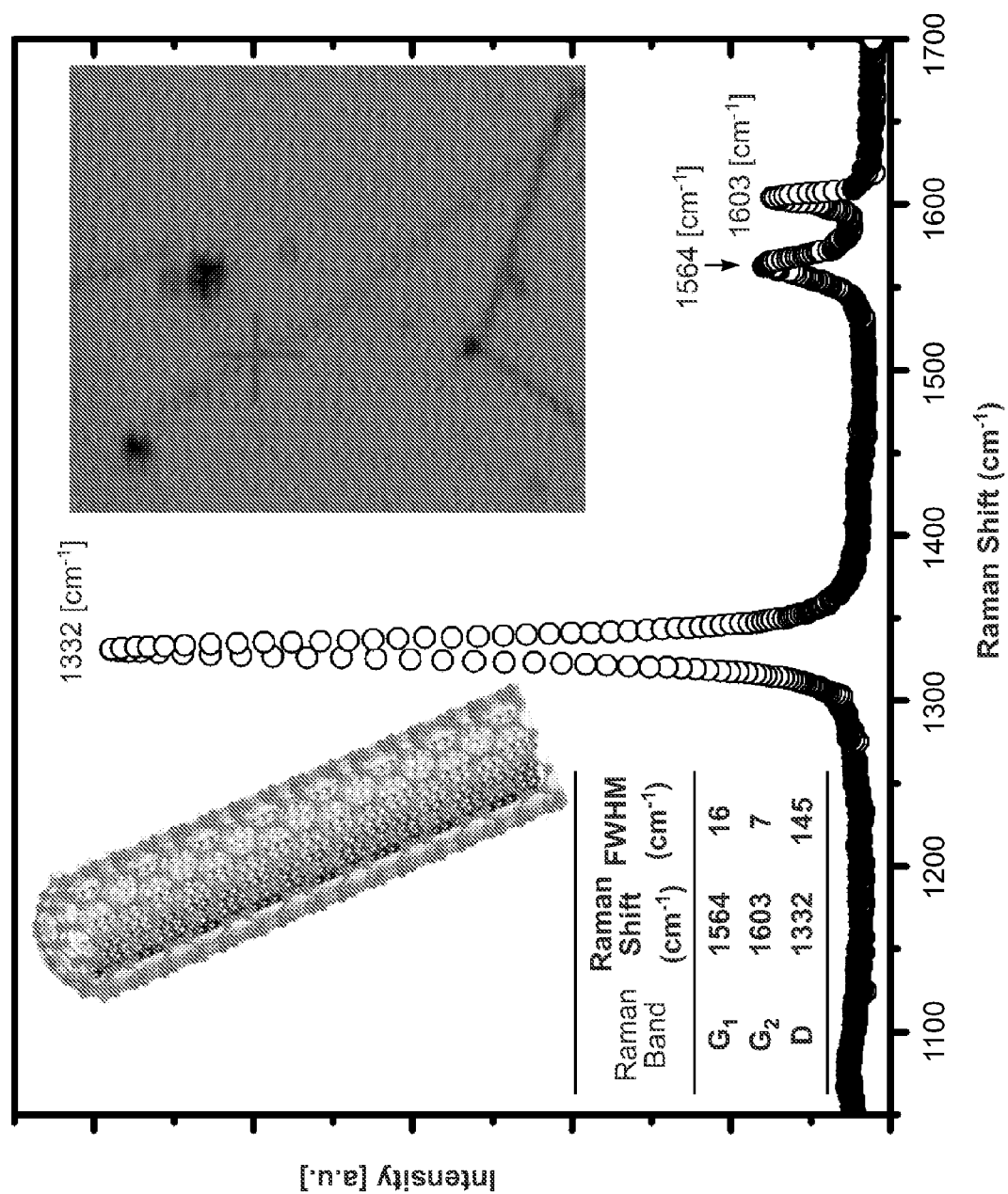
FIG. 3 depicts a micro-Raman spectrum taken from the same nanowire showed in the SEM image (FIG. 1A). The diamond signature peak at 1332 $cm^{-1}$ is narrow and pronounced, and the two Raman peaks at 1564 and 1603 $cm^{-1}$ demonstrate the presence of a CNT shell. The inset depicts the optical microscope image of the diamond nanowire placed in the Raman system corresponding to the SEM provided in FIG. 1A. The cross hair in the inset marks the location where the Raman laser beam (spot size ~1 micron) impinged on the diamond nanowire sample. The figure also includes (top left) a graphic impression showing formation of the nanowire within a shell.

Micro-Raman spectra, taken with a 532 nm laser beam focused on randomly selected microspots of individual isolated nanowires (e.g., a the point indicated by a red cross in the inset if FIG. 3), revealed the signature diamond peak (Knight, D. S. et al., *J. Mater. Res.* 1989, 4, 385-393) at 1332 $cm^{-1}$, dominant in intensity and extremely narrow in line width (see FIG. 3). Its fwhm of 14.5 $cm^{-1}$ was comparable to that of high-quality CVD-grown bulk diamond nanocrystallite films (Ferrari, A. C et al., *Trans, R. Soc. London, Ser. A* 2004, 362, 2477-2512). The two additional peaks at 1564 and 1603 $cm^{-1}$ were those of the well-known graphitic G-bands (Jorio, A et al., *Phys, Rev. B.* 2002, 65, 155412-155412-9). Since the micro-Raman spectroscopy was performed on individual isolated nanowires as shown in FIG. 3, these G-band peaks support the HRTEM evidence of a graphitic shell and a diamond core-in-nanotube shell structure. No such spectral lines were observed from the substrate when moving the excitation beam away from the wire. The Raman line at 1150 $cm^{-1}$ often seen in CVD-grown nano-diamond films is absent here, as is its associated 1450 $cm^{-1}$ peak. These lines, if present, are usually indicative of poor quality diamond crystals (Ferrari, A. C et al., *J. Phys. Rev. B* 2001, 63, 121405-1121405-4).

Since fabrication was carried out under atmospheric pressure and low temperature compared with the thermo-dynamic nonequilibrium plasma systems that are commonly used in diamond synthesis, it is likely that the growth mechanism differs from the traditional CVD diamond growth mechanism.

What is claimed is:

1. A method of making a core-in-shell structure having a diamond core and a carbon nanotube sheath comprising flowing a carbon precursor gas and a reducing gas through a chemical vapor deposition chamber including a transition metal catalyst solution on a substrate at atmospheric pressure and at a first temperature sufficient to create a carbon nanotube sheath followed by lowering the temperature to ambient while flowing pure reducing gas through the chemical vapor deposition chamber to create a diamond core within the carbon nanotube sheath.

2. The method according to claim 1 wherein the carbon precursor gas is methane or carbon dioxide.

3. The method according to claim 1 wherein the transition metal catalyst solution is a transition metal catalyst solution of iron, nickel, cobalt, manganese, chromium, alumina, or tantalum.

4. The method of claim 1 wherein the reducing gas is hydrogen.

5. The method according to claim 1 wherein the first temperature is 900° C.

6. The method according to claim 1 further comprising a transition metal catalyst solution dispersed on the substrate.

7. The method according to claim 6 wherein the transition metal catalyst is an iron catalyst solution.

8. The method according to claim 1 wherein the diamond nanowires are straight and uniform in diameter.

9. The method according to claim 1 wherein the diamond nanowires are comprised of crystal domains of at least 30 nm×30 nm.

10. The method according to claim 1 wherein the diamond nanowires are individually comprised of single crystals with low defect levels.

11. The method according to claim 1 wherein the diamond nanowires have a cubic diamond structure.

12. The method according to claim 1 wherein the diamond nanowires are encased within a graphite shell or layers of amorphous carbon.

* * * * *